(12) United States Patent
Chang et al.

(10) Patent No.: US 9,684,982 B2
(45) Date of Patent: Jun. 20, 2017

(54) ISOTROPIC VOLUME RECONSTRUCTION FROM MULTIPLE 2D SCANS USING SUPER-RESOLUTION TECHNIQUES

(71) Applicant: Siemens Healthcare GmbH, Erlangen (DE)

(72) Inventors: Ti-chiun Chang, Princeton Junction, NJ (US); Xiaoguang Lu, West Windsor, NJ (US); Peter Speier, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 38 days.

(21) Appl. No.: 14/842,157

(22) Filed: Sep. 1, 2015

(65) Prior Publication Data
US 2017/0061652 A1    Mar. 2, 2017

(51) Int. Cl.
| | |
|---|---|
| *G06K 9/00* | (2006.01) |
| *G06T 11/00* | (2006.01) |
| *G06T 7/00* | (2017.01) |
| *G06K 9/52* | (2006.01) |
| *G06T 5/20* | (2006.01) |

(Continued)

(52) U.S. Cl.
CPC ........ *G06T 11/005* (2013.01); *G01R 33/5608* (2013.01); *G06K 9/522* (2013.01); *G06T 5/20* (2013.01); *G06T 7/0012* (2013.01); *G06T 2207/10088* (2013.01)

(58) Field of Classification Search
USPC ....... 382/100, 103, 106, 128–133, 154, 162, 382/173, 181, 199, 232, 254, 274, 276, 382/286, 291, 305, 312; 324/309; 378/4, 378/21, 65; 345/419; 14/100, 103, 106, 14/128–133, 154, 162, 173, 181, 199,
(Continued)

(56) References Cited

U.S. PATENT DOCUMENTS

| | | | | |
|---|---|---|---|---|
| 2004/0066912 | A1* | 4/2004 | Bruder | ............... G06T 11/008 378/65 |
| 2010/0329528 | A1* | 12/2010 | Hajnal | ............... A61B 5/055 382/131 |

(Continued)

OTHER PUBLICATIONS

J.Pauly et al. "Parameter Relations for the Shinnar-LeRoux Selective Excitation Pulse Design Algorithm", IEEE Transaction on Medical Imaging, vol. 10, No. 1, Mar. 1991, pp. 53-65.
Staehle, F., et al. "Off-resonance-dependent slice profile effects in balanced steady-state free precession imaging." Magnetic resonance in medicine 59.5 (2008): 1197-1202.

(Continued)

*Primary Examiner* — Seyed Azarian (57) ABSTRACT

A computer-implemented method for performing isotropic reconstruction of Magnetic Resonance Imaging (MRI) data includes receiving a stack of slices acquired by an MRI device in two or more directions and reslicing the stack of slices into (i) an acquired view stack comprising high-resolution slices acquired in-plane, and (ii) a reslice stack comprising degraded slices acquired out of plane. An estimated slice profile is generated based on the stack of slices and the acquired view stack is convolved with the estimated slice profile to yield a simulated distorted slice stack. The simulated distorted slice stack is subtracted from the acquired view stack to yield a high-frequency band estimate and the high-frequency band estimate is combined with the reslice stack to yield isotropic reconstruction results.

17 Claims, 8 Drawing Sheets

(51) Int. Cl.
*G01R 33/56* (2006.01)
*A61B 6/00* (2006.01)

(58) Field of Classification Search
USPC ......... 14/232, 254, 274, 276, 286, 291, 305, 14/312, 275
See application file for complete search history.

(56) References Cited

U.S. PATENT DOCUMENTS

| | | | | |
|---|---|---|---|---|
| 2012/0032677 A1* | 2/2012 | Dannels | ............. | G01R 33/5659 324/309 |
| 2012/0121152 A1* | 5/2012 | Lu | ......................... | G06K 9/6857 382/131 |
| 2013/0021337 A1* | 1/2013 | Blum | ..................... | A61B 5/055 345/419 |

OTHER PUBLICATIONS

Deppe, Martin H., et al. "Slice profile effects in 2D slice-selective MRI of hyperpolarized nuclei." Journal of Magnetic Resonance 202.2 (2010): 180-189.

Gholipour, Ali, Judy A. Estroff, and Simon K. Warfield. "Robust super-resolution volume reconstruction from slice acquisitions: application to fetal brain MRI." IEEE transactions on Medical Imaging 29.10 (2010): 1739-1758.

Hefnawy, Alaa A. "An efficient super-resolution approach for obtaining isotropic 3-D imaging using 2-D multi-slice MRI." Egyptian Informatics Journal 14.2 (2013): 117-123.

Aganj, Iman, et al. "A 3D wavelet fusion approach for the reconstruction of isotropic-resolution MR images from orthogonal anisotropic-resolution scans." Magnetic resonance in medicine 67.4 (2012): 1167-1172.

* cited by examiner

ISOTROPIC VOLUME RECONSTRUCTION FROM MULTIPLE 2D SCANS USING SUPER-RESOLUTION TECHNIQUES

TECHNOLOGY FIELD

The present invention relates generally to methods, systems, and apparatuses for performing isotropic volume Magnetic Resonance Imaging (MRI) reconstruction from multiple two-dimensional (2D) scans using super-resolution techniques. The disclosed techniques may be applied to enhance image resolution in a variety of MRI clinical applications.

BACKGROUND

In a variety of clinical applications, it is desirable to have high-resolution three-dimensional (3D) images of the object of interest. In most conventional systems, two-dimensional (2D) acquisitions are employed where the slice thickness is significantly larger than the in-plane resolution. Accordingly, it is desirable to provide systems and methods for reconstructing an isotropic 3D volume from multiple stacks of 2D acquisitions.

SUMMARY

Embodiments of the present invention address and overcome one or more of the above shortcomings and drawbacks, by providing methods, systems, and apparatuses related to performing isotropic volume reconstruction from multiple 2D Magnetic Resonance Imaging (MRI) scans using super-resolution techniques.

According to some embodiments of the present invention, a computer-implemented method for performing isotropic reconstruction of Magnetic Resonance Imaging (MRI) data includes receiving a stack of slices acquired by an MRI device in two or more directions and reslicing the stack of slices into (i) an acquired view stack comprising high-resolution slices acquired in-plane, and (ii) a reslice stack comprising degraded slices acquired out of plane. An estimated slice profile is generated based on the stack of slices and the acquired view stack is convolved with the estimated slice profile to yield a simulated distorted slice stack. The simulated distorted slice stack is subtracted from the acquired view stack to yield a high-frequency band estimate and which is combined with the reslice stack to yield isotropic reconstruction results.

The aforementioned method may be modified with additional features, refinements, or other modifications in different embodiments. For example, the two or more directions may comprise (i) a first direction and (ii) a second direction that is orthogonal to the first direction. Alternatively, the two or more directions may be non-orthogonal. In some embodiments, prior to generating the estimated slice profile, an automated slice selection process is performed to remove one or more slices from the stack of slices. This automated slice selection process may be performed, for example, based on edges or intensity.

Additionally, the method of generating the estimated slice profile may vary in different embodiments of the aforementioned method. In some embodiments, the estimated slice profile is based on a division of a Fourier transformation of the acquired view stack and a Fourier transformation of the reslice stack. For example, in one embodiment, the estimated slice profile is generated by calculating a reslice summation comprising a pixel-wise summation of the reslice stack and applying a Fourier transform to the reslice summation to yield a transformed reslice stack. An acquired view summation comprising a pixel-wise summation of the acquired view stack is calculated and a Fourier transform is applied to the acquired view summation to yield a transformed acquired view stack. Then, the transformed reslice stack is divided by the acquired view stack to yield a quotient value. A Gaussian lowpass filter is applied to the quotient value to yield a filtered quotient and an inverse Fourier transform is applied to the filtered quotient to yield a transformed quotient. Slice profile information is extracted from the transformed quotient and the slice profile information is modeled as a Gaussian mixture to determine the estimated slice profile.

In other embodiments of the present invention, the estimated slice profile is based on a Wiener deconvolution which uses a model based on the acquired view stack and the reslice stack. For example, in one embodiment, the estimated slice profile is generated by calculating (i) a reslice summation comprising a pixel-wise summation of the reslice stack, (ii) an acquired view summation comprising a pixel-wise summation of the acquired view stack. A Wiener filter is applied to a transformed pair comprising the acquired view summation and the reslice summation to yield a minimum mean squared estimate. Slice profile information is extracted from the minimum mean squared estimate and the slice profile information is modeled as a Gaussian mixture to determine the estimated slice profile.

According to other embodiments of the present invention, an article of manufacture for performing isotropic reconstruction of MRI data comprises a non-transitory, tangible computer-readable medium holding computer-executable instructions for performing the aforementioned method, with or without the additional features discussed above.

According to other embodiments of the present invention, a system for performing isotropic reconstruction of MRI data includes an imaging device and an image data processor. The imaging device is configured to acquire a stack of slices in two or more directions. The image data processor is configured to reslice the stack of slices into (i) an acquired view stack comprising high-resolution slices acquired in-plane, and (ii) a reslice stack comprising degraded slices acquired out of plane. The image data processor is further configured to generate an estimated slice profile based on the stack of slices, convolve the acquired view stack with the estimated slice profile to yield a simulated distorted slice stack, subtract the simulated distorted slice stack from the acquired view stack to yield a high-frequency band estimate, and combine the high-frequency band estimate with the reslice stack to yield isotropic reconstruction results.

The image data processor may be configured with additional functionality in some embodiments. For example, in one embodiment, the image data processor, prior to generating the estimated slice profile, performs an automated slice selection process to remove one or more slices from the stack of slices. The image data processor may also be configured to generate the estimated slice profile based on a division of a Fourier transformation of the acquired view stack and a Fourier transformation of the reslice stack. Alternatively, the image data processor may be configured to generate the estimated slice profile based on a Wiener deconvolution which uses a model based on the acquired view stack and the reslice stack.

Additional features and advantages of the invention will be made apparent from the following detailed description of illustrative embodiments that proceeds with reference to the accompanying drawings.

BRIEF DESCRIPTION OF THE DRAWINGS

The foregoing and other aspects of the present invention are best understood from the following detailed description when read in connection with the accompanying drawings. For the purpose of illustrating the invention, the drawings show embodiments that are presently preferred, it being understood, however, that the invention is not limited to the specific instrumentalities disclosed. Included in the drawings are the following Figures.

DETAILED DESCRIPTION OF ILLUSTRATIVE EMBODIMENTS

The following disclosure describes the present invention according to several embodiments directed at methods, systems, and apparatuses related to reconstructing an isotropic 3D Magnetic Resonance Imaging (MRI) volume from multiple stacks of 2D acquisitions. Briefly, a slice profile is estimated and super-resolution is performed. The super-resolution is stabilized using complementary resolution of (orthogonal) stacks and image content. The proposed methods provide a robust foundation to super-resolution of MRI scans of various applications, offering high-resolution isotropic volume presentation of patient anatomies.

Figure 1:
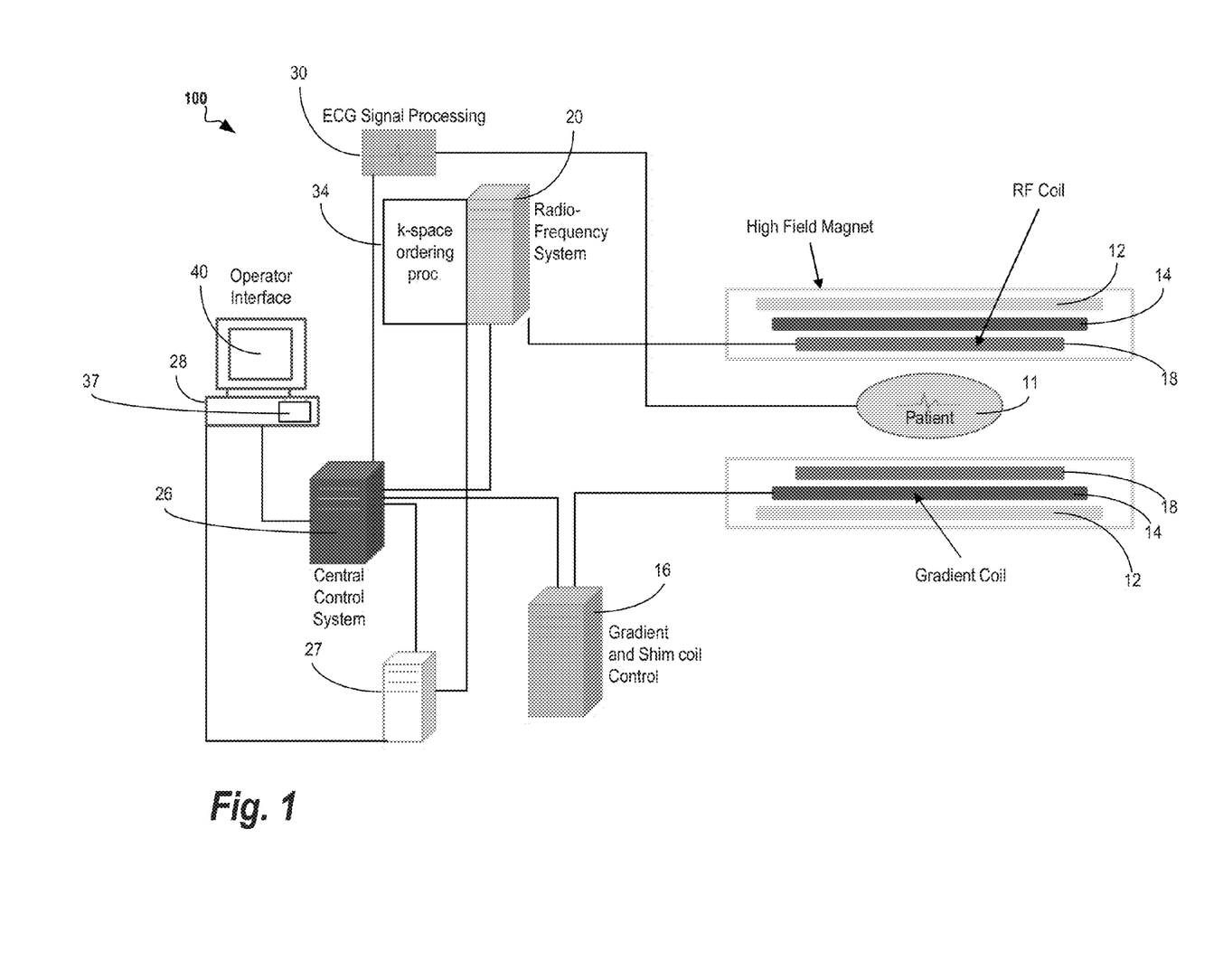
FIG. 1 shows a system for ordering acquisition of frequency domain components representing magnetic resonance image data for storage in a k-space storage array, as used by some embodiments of the present invention.

FIG. 1 shows a system 100 for ordering acquisition of frequency domain components representing MRI data for storage in a k-space storage array, as used by some embodiments of the present invention. In system 100, magnetic coils 12 create a static base magnetic field in the body of patient 11 to be imaged and positioned on a table. Within the magnet system are gradient coils 14 for producing position dependent magnetic field gradients superimposed on the static magnetic field. Gradient coils 14, in response to gradient signals supplied thereto by a gradient and shim coil control module 16, produce position dependent and shimmed magnetic field gradients in three orthogonal directions and generates magnetic field pulse sequences. The shimmed gradients compensate for inhomogeneity and variability in an MRI device magnetic field resulting from patient anatomical variation and other sources. The magnetic field gradients include a slice-selection gradient magnetic field, a phase-encoding gradient magnetic field and a readout gradient magnetic field that are applied to patient 11.

Further radio frequency (RF) module 20 provides RF pulse signals to RF coil 18, which in response produces magnetic field pulses which rotate the spins of the protons in the imaged body of the patient 11 by 90 degrees or by 180 degrees for so-called "spin echo" imaging, or by angles less than or equal to 90 degrees for so-called "gradient echo" imaging. Gradient and shim coil control module 16 in conjunction with RF module 20, as directed by central control unit 26, control slice-selection, phase-encoding, readout gradient magnetic fields, radio frequency transmission, and magnetic resonance signal detection, to acquire magnetic resonance signals representing planar slices of patient 11.

In response to applied RF pulse signals, the RF coil 18 receives magnetic resonance signals, i.e., signals from the excited protons within the body as they return to an equilibrium position established by the static and gradient magnetic fields. The magnetic resonance signals are detected and processed by a detector within RF module 20 and k-space component processor unit 34 to provide a magnetic resonance dataset to an image data processor for processing into an image. In some embodiments, the image data processor is located in central control unit 26. However, in other embodiments such as the one depicted in FIG. 1, the image data processor is located in a separate unit 27. ECG synchronization signal generator 30 provides ECG signals used for pulse sequence and imaging synchronization. A two or three dimensional k-space storage array of individual data elements in k-space component processor unit 34 stores corresponding individual frequency components comprising a magnetic resonance dataset. The k-space array of individual data elements has a designated center and individual data elements individually have a radius to the designated center.

A magnetic field generator (comprising coils 12, 14, and 18) generates a magnetic field for use in acquiring multiple individual frequency components corresponding to individual data elements in the storage array. The individual frequency components are successively acquired in an order in which radius of respective corresponding individual data elements increases and decreases along a substantially spiral path as the multiple individual frequency components are sequentially acquired during acquisition of a magnetic resonance dataset representing an magnetic resonance image. A storage processor in the k-space component processor unit 34 stores individual frequency components acquired using the magnetic field in corresponding individual data elements in the array. The radius of respective corresponding individual data elements alternately increases and decreases as multiple sequential individual frequency components are acquired. The magnetic field acquires individual frequency components in an order corresponding to a sequence of substantially adjacent individual data elements in the array and magnetic field gradient change between successively acquired frequency components is substantially minimized.

Central control unit 26 uses information stored in an internal database to process the detected magnetic resonance signals in a coordinated manner to generate high quality images of a selected slice(s) of the body (e.g., using the image data processor) and adjusts other parameters of system 100. The stored information comprises predetermined pulse sequence and magnetic field gradient and strength data as well as data indicating timing, orientation and spatial volume of gradient magnetic fields to be applied in imaging. Generated images are presented on display 40 of the operator interface. Computer 28 of the operator interface includes a graphical user interface (GUI) enabling user interaction with central control unit 26 and enables user modification of magnetic resonance imaging signals in substantially real time. Continuing with reference to FIG. 1, display processor 37 processes the magnetic resonance signals to reconstruct one or more images for presentation on display 40, for example. Various techniques may be used for reconstruction. For example, as described in greater detail below, an optimization algorithm is applied to iteratively solve a cost function which results in the reconstructed image.

Figure 2A:
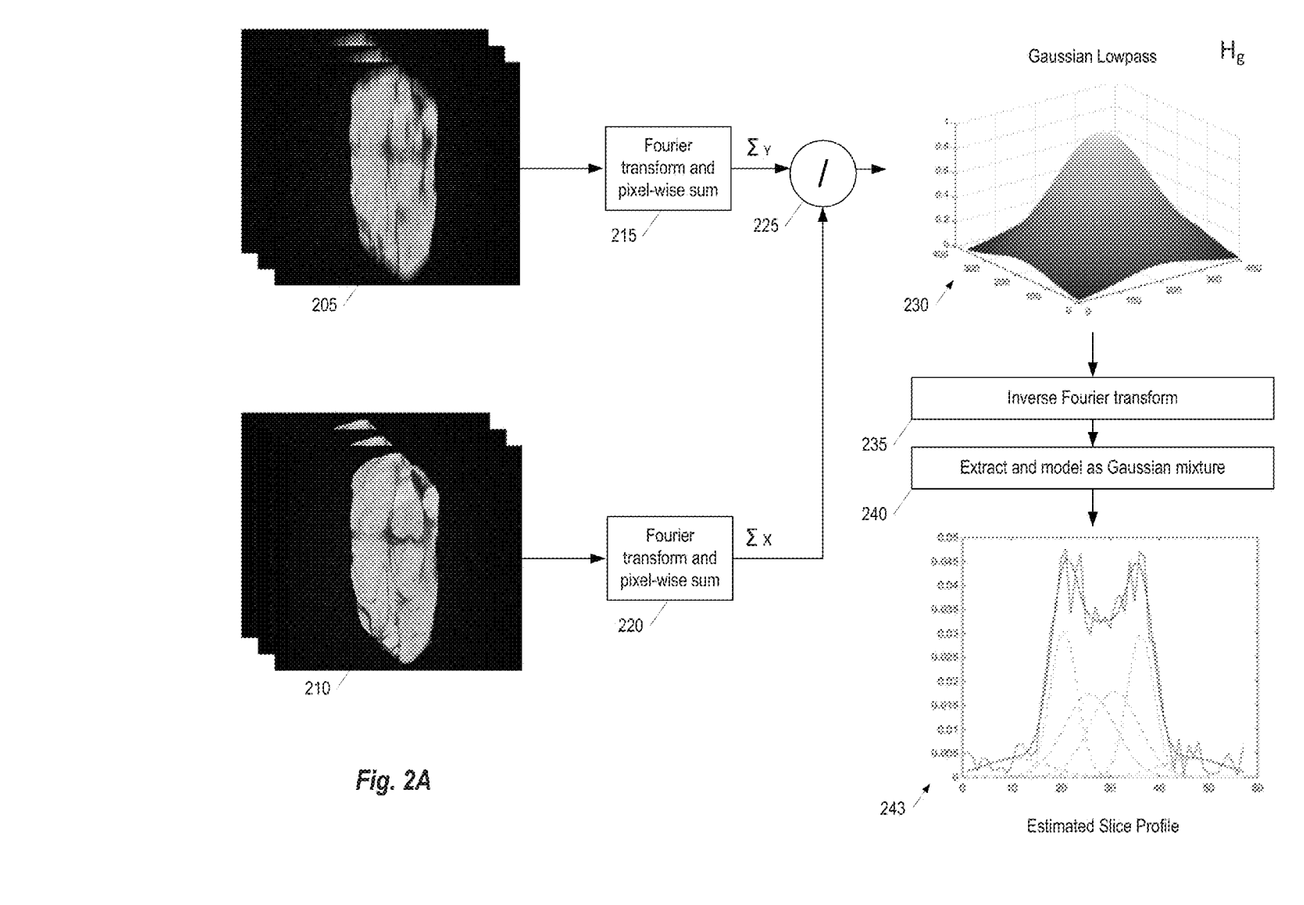
FIG. 2A illustrates one way of estimating a slice profile, according to some embodiments of the present invention.
Figure 2B:
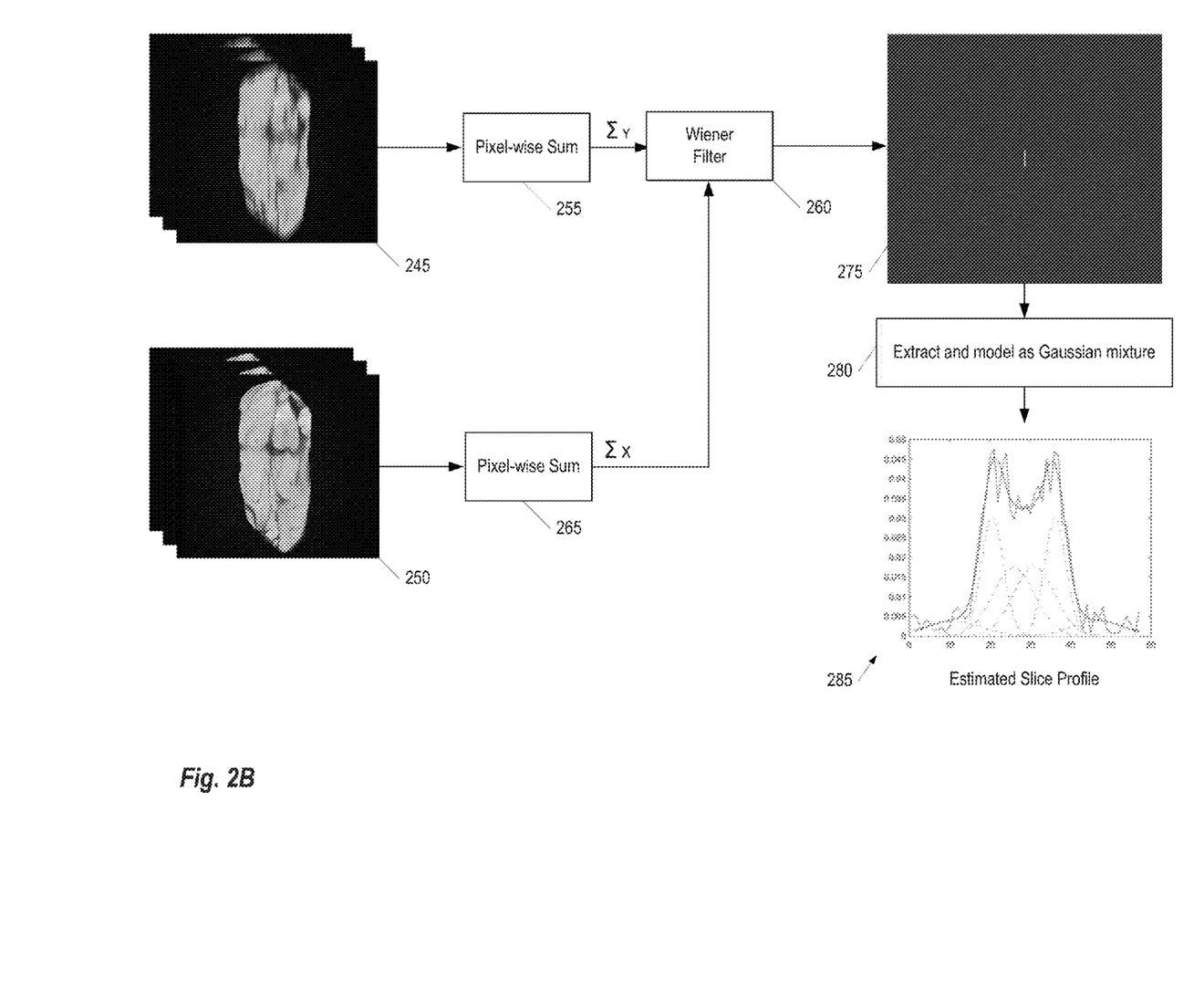
FIG. 2B illustrates an alternate way of estimating a slice profile, according to some embodiments of the present invention.

FIGS. 2A and 2B illustrate two ways of estimating a slice profile, according to different embodiments of the present invention. A slice profile describes the amount of excitation caused by a slice-selective RF excitation pulse. Each slice profile may be visualized as a plot of signal strength through a slice in a direction at right angles to the plane of the slice. For example, a transverse slice has a profile which may be plotted through the slice in the z-direction. The slice profile of a MRI scan can be used to resolve large acquisition gap and slice thickness in a widely employed 2D image sequence scan, resulting in isotropic high resolution volume. This process is referred to as super-resolution. In theory, the nominal slice profile can be calculated from the Fourier transform of the RF pulse shape. In practice however, the slice profile is object dependent and can deviate from the nominal one to a large degree. However, using the techniques described in FIGS. 2A and 2B, the physical slice profile may be estimated in order to achieve super-resolution.

To estimate the slice profile, the techniques described in FIGS. 2A and 2B exploit the fact that multiple MRI scans are just different slicing of the same object, after image interpolation and alignment, if necessary. For example, assume that the transverse stack is the high resolution in-plane acquisition. This acquisition can be treated as the target (the input of the system h(.) whose impulse response is the slice profile) for the transverse view of the sagittal stack (the output of the system h(.)). Then, the input-output relationship of the slice profile can be established. The multiple slices may also be utilized to increase the signal to noise ratio, thus producing a robust estimation of the physical slice profile.

In FIG. 2A, the slice profile is estimated based on a direct division between the output and input Fourier coefficients of the corresponding slices, followed by a low-pass filter. A first stack 205 represents the sagittal stack, transverse view, while a second stack 210 represents the transverse stack, transverse view. At step 215, the pixel-wise sum is computed among different slices (through-plane) of the first stack 205 and then a Fourier transform is applied along the low-resolution direction. This is equivalent to performing the Fourier transform and then summing the pixels through plane. At step 220, the pixel-wise sum is again computed among the second stack 210, and a Fourier transform is applied along a high-resolution direction. At step 225, the Fourier coefficients of the summation results of 215 are divided pixel-wise by the results of 220. A Gaussian lowpass filter (depicted by plot 230) is applied to the quotient resulting from the division 225. At step 235, an inverse Fourier transformation is applied to the filtered result. Then, at step 240, slice profile information is extracted from the transformed result and modeled as a Gaussian mixture to result in the estimated slice profile 243.

FIG. 2B estimates the slice profile using a Wiener filter. The Wiener filter is generally known in the art and, thus, it is only briefly described herein. Briefly, the Wiener Filter is a deconvolution algorithm which determines a minimum mean square estimate for the ideal input given the observed distorted output, which is just the system response of the (ideal) input. A first stack 245 represents the sagittal stack, transverse view, while a second stack 250 represents the transverse stack, transverse view. At 255, as in FIG. 2A, the pixel-wise sum is computed through-plane for the first stack. At step 265, the pixel-wise sum is computed through-plane for the second stack. At step 260, the Wiener Filter is applied to the summation produced by step 255 and the summation produced by step 265 to yield the minimum mean square estimate (depicted in image 275). At step 280, slice profile information is extracted from the minimum mean square estimate and modeled as a Gaussian mixture to result in the estimated slice profile 285.

Figure 3:
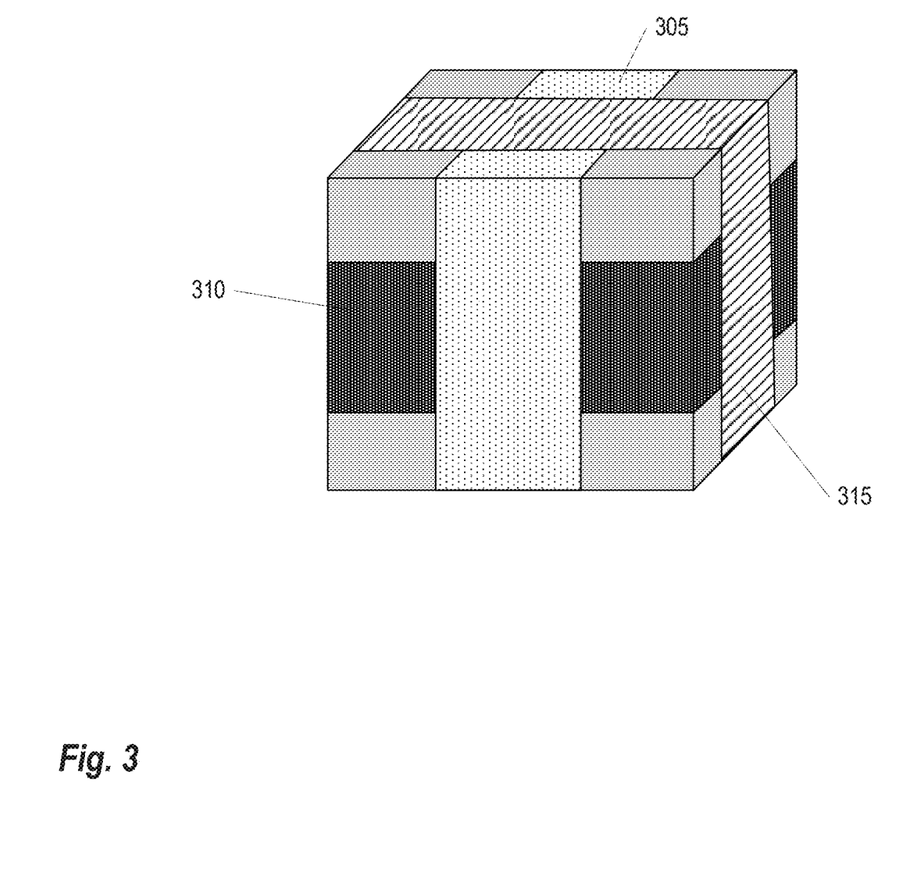
FIG. 3 provides a 3D frequency domain interpretation of multi-stack fusion, according to some embodiments.

The slice profile estimate may be utilized in performing fusion of multiple stacks (herein referred to as "multi-stack fusion."). FIG. 3 provides a 3D frequency domain interpretation of multi-stack fusion, according to some embodiments. This example provides an illustration of a Fourier space represented as a cube where values of 0 are represented with a solid gray. Each acquired stack provides a slab of frequency information out of the complete Fourier space. Three slabs are illustrated in FIG. 3: slab 305 (represented by black dots on a white background), slab 310 (represented by white dots on a black background), and slab 315 (represented by black stripes on a white background). These three slabs 305, 310, 315 are orthogonal when the stacks are also orthogonal to one another. The goal is to construct a single volume that contains all the information from these three stacks.

One way is to formulate the forward model, and to solve the inverse problem using an iterative algorithm. The forward model refers to an unknown target volume, undergoing a convolution with an idealized slice profile, should be matched to the actual 2D acquisition. Because the target volume is unknown, an initial guess would be given. Then an iterative procedure attempts to update the trial solution until a stopping criterion is satisfied. The mismatch between the forward model and the acquisitions can be, for example, a pre-selected error norm or the least squared penalty with the addition of a regularization term. This approach is computational intensive, and depends much on the robustness of the adopted optimization algorithms. Another approach decomposes the multiple stacks into sub-band images using the wavelet transform. The sub-band images can be considered as a partition of the Fourier space; and each sub-band image corresponds to a portion of the Fourier spectra. Then, complementary sub-band images from different stacks are re-grouped to form the complete Fourier space. A major drawback with this wavelet fusion is that the frequency band partition is not a model of the physical process; thus, the outcomes are both aesthetic and arbitrary, without any guarantee to recover the accurate image structures.

Figure 4A:
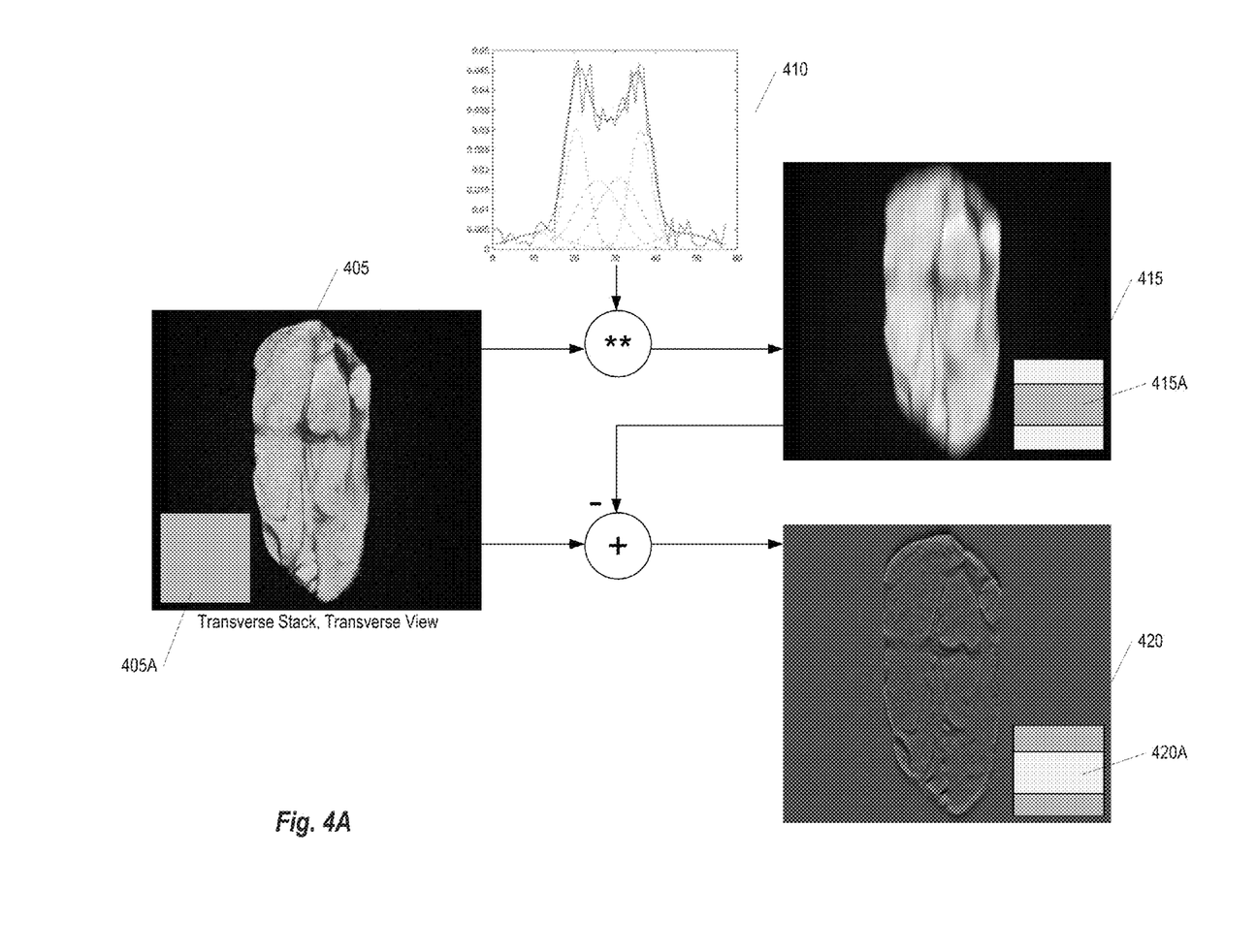
FIG. 4A an illustration of a first step in a multi-stack fusion process that may be employed in some embodiments of the present invention.
Figure 4B:
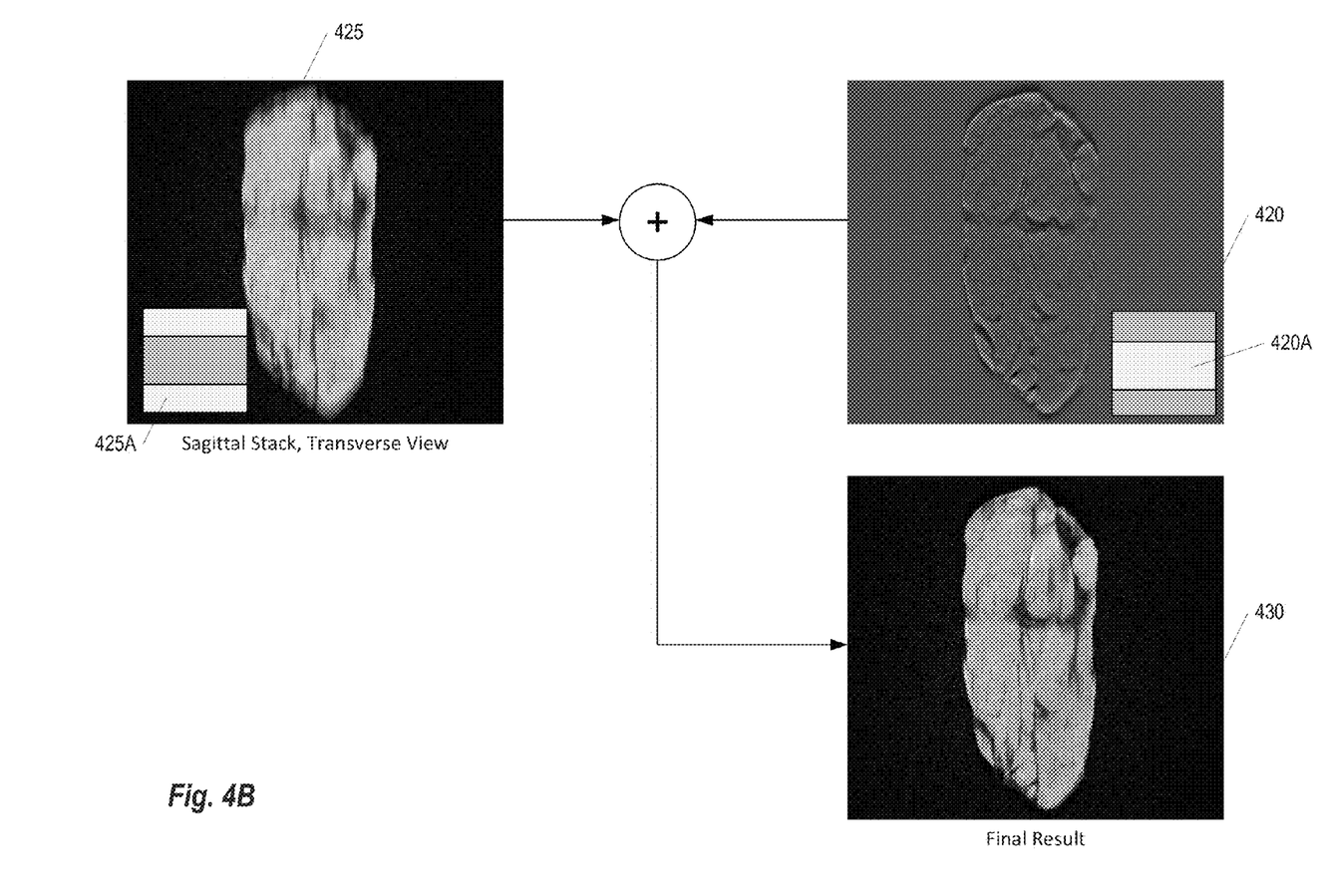
FIG. 4B an illustration of a second step in a multi-stack fusion process that may be employed in some embodiments of the present invention.

FIGS. 4A and 4B provide an illustration of an alternative multi-stack fusion process that may be employed in some embodiments of the present invention. FIG. 4A provides an illustration of a first step applied during this process. In this example, an estimated slice profile 410 is applied to the transverse acquisition of a starting image 405 to obtain a simulated degraded image 415 (i.e., forward model). The simulated degraded image 415 is subtracted from the starting image 405 to arrive at a bandpass image 420, whose frequency content is complementary to the slice profile 410. Insets 405A, 415A, and 420A illustrate the frequency domain corresponding to images 405, 415, and 420, respectively. An alternative implementation is to use an all-pass filter (all is in terms of the frequency spectra or an impulse in the spatial domain) to subtract the estimated slice profile 410, resulting in a high-pass filter. The convolution between this high-pass filter and the starting image 405 directly leads to the bandpass image 420.

FIG. 4B provides an illustration of a second step applied in the process started in FIG. 4A. As shown in FIG. 4B, a bandpass image 420 can be added to the base sagittal stack image 425 (with frequency domain 425A), which is resliced to the same view as the transverse stack. The output image 430 of this procedure achieves the complementary frequency fusion. Therefore, not only the existing structures in the sagittal stack are preserved, but also the degradation due to slice profile is recovered, as can be seen by comparing the output image 430 with the high-resolution transverse acquisition in the starting image 405 shown in FIG. 4A. Following the second step shown in FIG. 4B, the slice profile between the output volume shown in FIG. 4B and the third coronal stack may be estimated. The same procedure as illustrated in FIGS. 4A and 4B can be repeated with the role of transverse stack now becomes the coronal stack; and the base stack is the output of the procedure described above. After this step, the three stacks can be fused together with complementary frequency information as desired.

Figure 5:
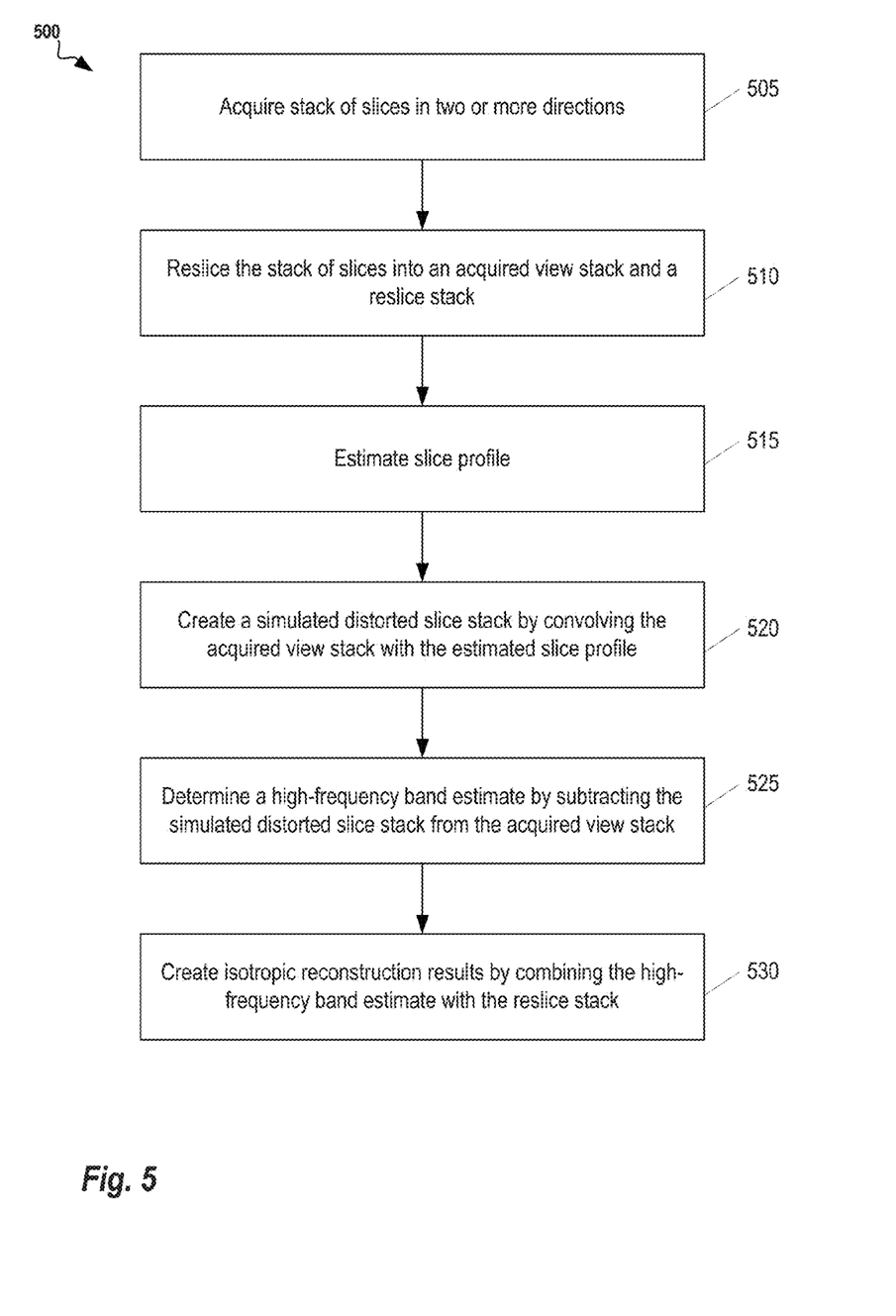
FIG. 5 provides a flowchart showing a computer-implemented method for performing isotropic reconstruction of MRI data.

FIG. 5 provides a flowchart showing a computer-implemented method 500 for performing isotropic reconstruction of MRI data. This method may be performed, for example, using the image data processor described above with respect to FIG. 1. At step 505, an MRI device (see, e.g., FIG. 1) is used to acquire stack of slices in two or more directions. For the simplest case, these two directions are orthogonal. However, the techniques described herein may also be extended to the general case where the two directions are orthogonal.

Next, at step 510, the stack of slices is resliced into two stacks. The first stack is an "acquired view stack" comprising high-resolution slices acquired in-plane. The second stack is a "reslice stack" which includes degraded slices acquired out of plane. At step 515, the stack of slices is used to generate an estimate slice profile. In some embodiments, prior to generating the estimated slice profile, a slice selection process may be used to remove one or more slices from the stack of slices in order to speed up and simplify processing. Various criteria may be used in removing the slices but, in general, the removed slices are those that include little or no image data. The image data may be analyzed, for example, using edge detection algorithms or intensity measurements to identify substantive portions of the image data.

Continuing with reference to FIG. 5, at step 520 the acquired view stack is convolved with the estimated slice profile to yield a simulated distorted slice stack. In some embodiments, the estimated slice profile is based on a division of a Fourier transformation of the acquired view stack and a Fourier transformation of the reslice stack (see, e.g., FIG. 2A). In other embodiments, the estimated slice profile is based on a Wiener deconvolution which uses a model based on the acquired view stack and the reslice stack (see, e.g., FIG. 2B). At step 525, the simulated distorted slice stack is subtracted from the acquired view stack to yield a high-frequency band estimate. Finally, at step 530, the high-frequency band estimate is combined with the reslice stack to yield isotropic reconstruction results.

Figure 6:
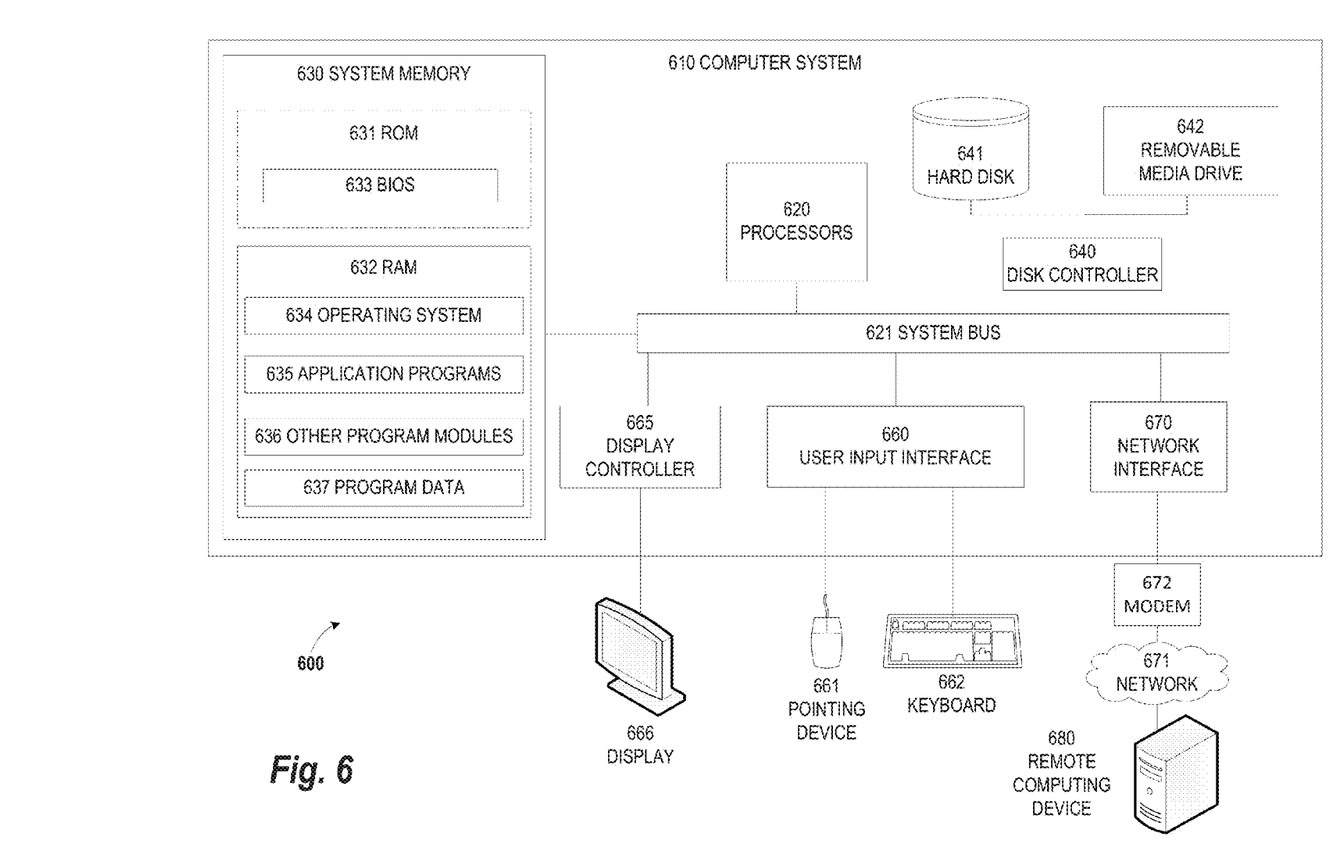
FIG. 6 illustrates an exemplary computing environment within which embodiments of the invention may be implemented.

FIG. 6 illustrates an exemplary computing environment 600 within which embodiments of the invention may be implemented. For example, this computing environment 600 may be used to implement the methods 500 described in FIG. 5. In some embodiments, the computing environment 600 may be used to implement one or more of the components illustrated in the system 100 of FIG. 1. The computing environment 600 may include computer system 610, which is one example of a computing system upon which embodiments of the invention may be implemented. Computers and computing environments, such as computer system 610 and computing environment 600, are known to those of skill in the art and thus are described briefly here.

As shown in FIG. 6, the computer system 610 may include a communication mechanism such as a bus 621 or other communication mechanism for communicating information within the computer system 610. The computer system 610 further includes one or more processors 620 coupled with the bus 621 for processing the information. The processors 620 may include one or more central processing units (CPUs), graphical processing units (GPUs), or any other processor known in the art.

The computer system 610 also includes a system memory 630 coupled to the bus 621 for storing information and instructions to be executed by processors 620. The system memory 630 may include computer readable storage media in the form of volatile and/or nonvolatile memory, such as read only memory (ROM) 631 and/or random access memory (RAM) 632. The system memory RAM 632 may include other dynamic storage device(s) (e.g., dynamic RAM, static RAM, and synchronous DRAM). The system memory ROM 631 may include other static storage device(s) (e.g., programmable ROM, erasable PROM, and electrically erasable PROM). In addition, the system memory 630 may be used for storing temporary variables or other intermediate information during the execution of instructions by the processors 620. A basic input/output system (BIOS) 633 containing the basic routines that help to transfer information between elements within computer system 610, such as during start-up, may be stored in ROM 631. RAM 632 may contain data and/or program modules that are immediately accessible to and/or presently being operated on by the processors 620. System memory 630 may additionally include, for example, operating system 634, application programs 635, other program modules 636 and program data 637.

The computer system 610 also includes a disk controller 640 coupled to the bus 621 to control one or more storage devices for storing information and instructions, such as a hard disk 641 and a removable media drive 642 (e.g., floppy disk drive, compact disc drive, tape drive, and/or solid state drive). The storage devices may be added to the computer system 610 using an appropriate device interface (e.g., a small computer system interface (SCSI), integrated device electronics (IDE), Universal Serial Bus (USB), or FireWire).

The computer system 610 may also include a display controller 665 coupled to the bus 621 to control a display 666, such as a cathode ray tube (CRT) or liquid crystal display (LCD), for displaying information to a computer user. The computer system includes an input interface 660 and one or more input devices, such as a keyboard 662 and a pointing device 661, for interacting with a computer user and providing information to the processor 620. The pointing device 661, for example, may be a mouse, a trackball, or a pointing stick for communicating direction information and command selections to the processor 620 and for controlling cursor movement on the display 666. The display 666 may provide a touch screen interface which allows input to supplement or replace the communication of direction information and command selections by the pointing device 661.

The computer system 610 may perform a portion or all of the processing steps of embodiments of the invention in response to the processors 620 executing one or more sequences of one or more instructions contained in a memory, such as the system memory 630. Such instructions may be read into the system memory 630 from another computer readable medium, such as a hard disk 641 or a removable media drive 642. The hard disk 641 may contain one or more datastores and data files used by embodiments of the present invention. Datastore contents and data files may be encrypted to improve security. The processors 620 may also be employed in a multi-processing arrangement to execute the one or more sequences of instructions contained in system memory 630. In alternative embodiments, hard-wired circuitry may be used in place of, or in combination with, software instructions. Thus, embodiments are not limited to any specific combination of hardware circuitry and software.

As stated above, the computer system 610 may include at least one computer readable medium or memory for holding instructions programmed according to embodiments of the invention and for containing data structures, tables, records, or other data described herein. The term "computer readable medium" as used herein refers to any medium that participates in providing instructions to the processor 620 for execution. A computer readable medium may take many forms including, but not limited to, non-volatile media, volatile media, and transmission media. Non-limiting examples of non-volatile media include optical disks, solid state drives, magnetic disks, and magneto-optical disks, such as hard disk 641 or removable media drive 642. Non-limiting examples of volatile media include dynamic memory, such as system memory 630. Non-limiting examples of transmission media include coaxial cables, copper wire, and fiber optics, including the wires that make up the bus 621. Transmission media may also take the form of acoustic or light waves, such as those generated during radio wave and infrared data communications.

The computing environment 600 may further include the computer system 610 operating in a networked environment using logical connections to one or more remote computers, such as remote computer 680. Remote computer 680 may be a personal computer (laptop or desktop), a mobile device, a server, a router, a network PC, a peer device or other common network node, and typically includes many or all of the elements described above relative to computer system 610. When used in a networking environment, computer system 610 may include modem 672 for establishing communications over a network 671, such as the Internet. Modem 672 may be connected to bus 621 via user network interface 670, or via another appropriate mechanism.

Network 671 may be any network or system generally known in the art, including the Internet, an intranet, a local area network (LAN), a wide area network (WAN), a metropolitan area network (MAN), a direct connection or series of connections, a cellular telephone network, or any other network or medium capable of facilitating communication between computer system 610 and other computers (e.g., remote computer 680). The network 671 may be wired, wireless or a combination thereof. Wired connections may be implemented using Ethernet, Universal Serial Bus (USB), RJ-11 or any other wired connection generally known in the art. Wireless connections may be implemented using Wi-Fi, WiMAX, and Bluetooth, infrared, cellular networks, satellite or any other wireless connection methodology generally known in the art. Additionally, several networks may work alone or in communication with each other to facilitate communication in the network 671.

The embodiments of the present disclosure may be implemented with any combination of hardware and software. In addition, the embodiments of the present disclosure may be included in an article of manufacture (e.g., one or more computer program products) having, for example, computer-readable, non-transitory media. The media has embodied therein, for instance, computer readable program code for providing and facilitating the mechanisms of the embodiments of the present disclosure. The article of manufacture can be included as part of a computer system or sold separately.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

An executable application, as used herein, comprises code or machine readable instructions for conditioning the processor to implement predetermined functions, such as those of an operating system, a context data acquisition system or other information processing system, for example, in response to user command or input. An executable procedure is a segment of code or machine readable instruction, sub-routine, or other distinct section of code or portion of an executable application for performing one or more particular processes. These processes may include receiving input data and/or parameters, performing operations on received input data and/or performing functions in response to received input parameters, and providing resulting output data and/or parameters.

A graphical user interface (GUI), as used herein, comprises one or more display images, generated by a display processor and enabling user interaction with a processor or other device and associated data acquisition and processing functions. The GUI also includes an executable procedure or executable application. The executable procedure or executable application conditions the display processor to generate signals representing the GUI display images. These signals are supplied to a display device which displays the image for viewing by the user. The processor, under control of an executable procedure or executable application, manipulates the GUI display images in response to signals received from the input devices. In this way, the user may interact with the display image using the input devices, enabling user interaction with the processor or other device.

The functions and process steps herein may be performed automatically or wholly or partially in response to user command. An activity (including a step) performed automatically is performed in response to one or more executable instructions or device operation without user direct initiation of the activity.

The system and processes of the figures are not exclusive. Other systems, processes and menus may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. As described herein, the various systems, subsystems, agents, managers and processes can be implemented using hardware components, software components, and/or combinations thereof. No claim element herein is to be construed under the provisions of 35 U.S.C. 112, sixth paragraph, unless the element is expressly recited using the phrase "means for."

We claim:

1. A computer-implemented method for performing isotropic reconstruction of Magnetic Resonance Imaging (MRI) data, the method comprising:
   receiving a stack of slices acquired by an MRI device in two or more directions;
      reslicing the stack of slices into:
         an acquired view stack comprising high-resolution slices acquired in-plane, and
         a reslice stack comprising degraded slices acquired out of plane;
      generating an estimated slice profile based on the stack of slices;
      convolving the acquired view stack with the estimated slice profile to yield a simulated distorted slice stack;
      subtracting the simulated distorted slice stack from the acquired view stack to yield a high-frequency band estimate; and
      combining the high-frequency band estimate with the reslice stack to yield isotropic reconstruction results,
      wherein the estimated slice profile is based on a division of a Fourier transformation of the acquired view stack and a Fourier transformation of the reslice stack.

2. The method of claim 1, wherein the two or more directions comprise (i) a first direction and (ii) a second direction that is orthogonal to the first direction.

3. The method of claim 1, wherein the two or more directions comprise (i) a first direction and (ii) a second direction that is not orthogonal to the first direction.

4. The method of claim 1, further comprising:
   prior to generating the estimated slice profile, performing an automated slice selection process to remove one or more slices from the stack of slices.

5. The method of claim 4, wherein the automated slice selection process is performed based on edges.

6. The method of claim 4, wherein the automated slice selection process is performed based on intensity.

7. The method of claim 1, wherein the estimated slice profile is generated by a process comprising:
   calculating a reslice summation comprising a pixel-wise summation of the reslice stack;
   applying a Fourier transform to the reslice summation to yield a transformed reslice stack;
   calculating an acquired view summation comprising a pixel-wise summation of the acquired view stack;
   applying a Fourier transform to the acquired view summation to yield a transformed acquired view stack;
   dividing the transformed reslice stack by the acquired view stack to yield a quotient value;
   applying a Gaussian lowpass filter to the quotient value to yield a filtered quotient;
   applying an inverse Fourier transform to the filtered quotient to yield a transformed quotient;
   extracting slice profile information from the transformed quotient; and
   modeling the slice profile information as a Gaussian mixture to determine the estimated slice profile.

8. The method of claim 1, wherein the estimated slice profile is based on a Wiener deconvolution which uses a model based on the acquired view stack and the reslice stack.

9. The method of claim 8, wherein the estimated slice profile is generated by a process comprising:
   calculating a reslice summation comprising a pixel-wise summation of the reslice stack;
   calculating an acquired view summation comprising a pixel-wise summation of the acquired view stack;
   applying a Wiener filter to a transformed pair comprising the acquired view summation and the reslice summation to yield a minimum mean squared estimate;
   extracting slice profile information from the minimum mean squared estimate; and
   modeling the slice profile information as a Gaussian mixture to determine the estimated slice profile.

10. An article of manufacture for performing isotropic reconstruction of Magnetic Resonance Imaging (MM) data, the article of manufacture comprising a non-transitory, tangible computer-readable medium holding computer-executable instructions for performing a method comprising:
    receiving a stack of slices acquired by an MM device in two or more directions;
       reslicing the stack of slices into:
          an acquired view stack comprising high-resolution slices acquired in-plane, and
          a reslice stack comprising degraded slices acquired out of plane;
       generating an estimated slice profile based on the stack of slices;
       convolving the acquired view stack with the estimated slice profile to yield a simulated distorted slice stack;
       subtracting the simulated distorted slice stack from the acquired view stack to yield a high-frequency band estimate; and
       combining the high-frequency band estimate with the reslice stack to yield isotropic reconstruction results,
       wherein the estimated slice profile is based on a division of a Fourier transformation of the acquired view stack and a Fourier transformation of the reslice stack.

11. The article of manufacture of claim 10, further comprising:
    prior to generating the estimated slice profile, performing an automated slice selection process to remove one or more slices from the stack of slices.

12. The article of manufacture of claim 10, wherein the estimated slice profile is generated by a process comprising:
    calculating a reslice summation comprising a pixel-wise summation of the reslice stack;
    applying a Fourier transform to the reslice summation to yield a transformed reslice stack;
    calculating an acquired view summation comprising a pixel-wise summation of the acquired view stack;
    applying a Fourier transform to the acquired view summation to yield a transformed acquired view stack;
    dividing the transformed reslice stack by the acquired view stack to yield a quotient value;
    applying a Gaussian lowpass filter to the quotient value to yield a filtered quotient;
    applying an inverse Fourier transform to the filtered quotient to yield a transformed quotient;
    extracting slice profile information from the transformed quotient; and
    modeling the slice profile information as a Gaussian mixture to determine the estimated slice profile.

13. The article of manufacture of claim 10, wherein the estimated slice profile is based on a Wiener deconvolution which uses a model based on the acquired view stack and the reslice stack.

14. The article of manufacture of claim 13, wherein the estimated slice profile is generated by a process comprising:

calculating a reslice summation comprising a pixel-wise summation of the reslice stack;
calculating an acquired view summation comprising a pixel-wise summation of the acquired view stack;
applying a Wiener filter to a transformed pair comprising the acquired view summation and the reslice summation to yield a minimum mean squared estimate;
extracting slice profile information from the minimum mean squared estimate; and
modeling the slice profile information as a Gaussian mixture to determine the estimated slice profile.

15. A system for performing isotropic reconstruction of Magnetic Resonance Imaging (MM) data, the system comprising:
an imaging device configured to acquire a stack of slices in two or more directions;
an image data processor configured to:
reslice the stack of slices into (i) an acquired view stack comprising high-resolution slices acquired in-plane, and (ii) a reslice stack comprising degraded slices acquired out of plane,
generate an estimated slice profile based on the stack of slices,
convolve the acquired view stack with the estimated slice profile to yield a simulated distorted slice stack,
subtract the simulated distorted slice stack from the acquired view stack to yield a high-frequency band estimate, and
combine the high-frequency band estimate with the reslice stack to yield isotropic reconstruction results,
wherein the image data processor is configured to generate the estimated slice profile based on a Wiener deconvolution which uses a model based on the acquired view stack and the reslice stack.

16. The system of claim 15, wherein the image data processor is further configured to:
prior to generating the estimated slice profile, perform an automated slice selection process to remove one or more slices from the stack of slices.

17. The system of claim 15, wherein the image data processor is configured to generate the estimated slice profile based on a division of a Fourier transformation of the acquired view stack and a Fourier transformation of the reslice stack.

* * * * *